(12) United States Patent
Naro

(10) Patent No.: US 10,195,509 B1
(45) Date of Patent: Feb. 5, 2019

(54) BASKETBALL TRAINING APPARATUS WITH REAL-TIME USER FEEDBACK ON SHOOTING FORM

(71) Applicant: John Nicholas Naro, Portland, OR (US)

(72) Inventor: John Nicholas Naro, Portland, OR (US)

( * ) Notice: Subject to any disclaimer, the term of this patent is extended or adjusted under 35 U.S.C. 154(b) by 0 days.

(21) Appl. No.: 15/985,971

(22) Filed: May 22, 2018

Related U.S. Application Data

(60) Provisional application No. 62/509,554, filed on May 22, 2017.

(51) Int. Cl.
*A63B 69/00* (2006.01)
*G01R 33/07* (2006.01)
*A63B 71/06* (2006.01)

(52) U.S. Cl.
CPC .......... *A63B 69/0071* (2013.01); *G01R 33/07* (2013.01); *A63B 69/0059* (2013.01); *A63B 2071/0661* (2013.01); *A63B 2220/13* (2013.01); *A63B 2220/16* (2013.01); *A63B 2220/836* (2013.01); *A63B 2243/0037* (2013.01)

(58) Field of Classification Search
CPC ............ A63B 69/0071; A63B 69/0059; A63B 2220/836; A63B 69/3608; A63B 2220/16; A63B 2243/0037
USPC ...................... 473/447, 450, 422; 602/16, 20
See application file for complete search history.

(56) References Cited

U.S. PATENT DOCUMENTS

| | | | | |
|---|---|---|---|---|
| 3,698,389 A | * | 10/1972 | Guedel | A61F 5/013 473/214 |
| 5,149,085 A | * | 9/1992 | Sanchez | A63B 23/14 473/450 |
| 5,544,877 A | * | 8/1996 | Brownell | A63B 69/0059 473/450 |
| 5,816,952 A | * | 10/1998 | Blevins | A63B 69/0059 473/450 |
| 5,865,695 A | | 2/1999 | Mahala | |
| 6,478,758 B1 | * | 11/2002 | Hassler | A61F 5/013 602/16 |
| 7,367,958 B2 | * | 5/2008 | McBean | A61B 5/04888 602/16 |
| 7,410,471 B1 | * | 8/2008 | Campbell | A61B 5/6829 602/16 |
| 7,442,133 B2 | * | 10/2008 | Wolf | A63B 69/0059 473/450 |

(Continued)

*Primary Examiner* — Mark Graham
(74) *Attorney, Agent, or Firm* — Plager Schack LLP; Mark H. Plager; Eric Liou

(57) ABSTRACT

A basketball training apparatus to provide user feedback on shooting form is provided. The basketball training apparatus includes a strut assembly coupled to a user's upper arm and forearm, the strut assembly having an upper strut pivotably mounted to a lower strut, a Hall Effect sensor disposed within the junction of the upper and lower struts, a pair of magnets coupled to the strut assembly's junction, a controller disposed within the strut assembly and electrically coupled to the Hall Effect sensor, and an alert mechanism disposed within the strut assembly and electrically coupled to the controller. Pivotable movement of the upper strut relative to the lower strut to either a first optimal angle or second optimal angle enables the alert mechanism to generate a notification.

10 Claims, 3 Drawing Sheets

(56) References Cited

U.S. PATENT DOCUMENTS

| | | | | |
|---|---|---|---|---|
| 7,658,681 B1* | 2/2010 | Malecha | ............ | A63B 69/3608 473/214 |
| 7,771,293 B1* | 8/2010 | Vann | ................. | A63B 69/0071 473/422 |
| 7,775,898 B1* | 8/2010 | Allen | ................. | A63B 69/0059 473/207 |
| 8,038,549 B2 | 10/2011 | Vann | | |
| 8,152,660 B1* | 4/2012 | Jimenez, Jr. | ....... | A63B 69/0071 473/422 |
| 8,926,455 B2* | 1/2015 | Drozjock | ........... | A63B 69/0002 473/422 |
| 8,939,853 B1* | 1/2015 | Karn | .................. | A63B 69/0071 473/422 |
| 2002/0183673 A1* | 12/2002 | Naft | ...................... | A61F 5/0125 602/16 |
| 2007/0219025 A1* | 9/2007 | Aberton | ............. | A63B 24/0003 473/450 |
| 2011/0045925 A1* | 2/2011 | Moye | ................. | A63B 24/0006 473/450 |
| 2012/0100939 A1* | 4/2012 | Townsend | ......... | A63B 69/0071 473/450 |
| 2012/0190483 A1 | 7/2012 | Grover | | |
| 2016/0089573 A1* | 3/2016 | House | ................... | A61F 5/0102 482/8 |
| 2016/0338644 A1* | 11/2016 | Connor | .................... | G06F 3/014 |
| 2017/0189756 A1* | 7/2017 | Brothers | ............ | A63B 24/0075 |

* cited by examiner

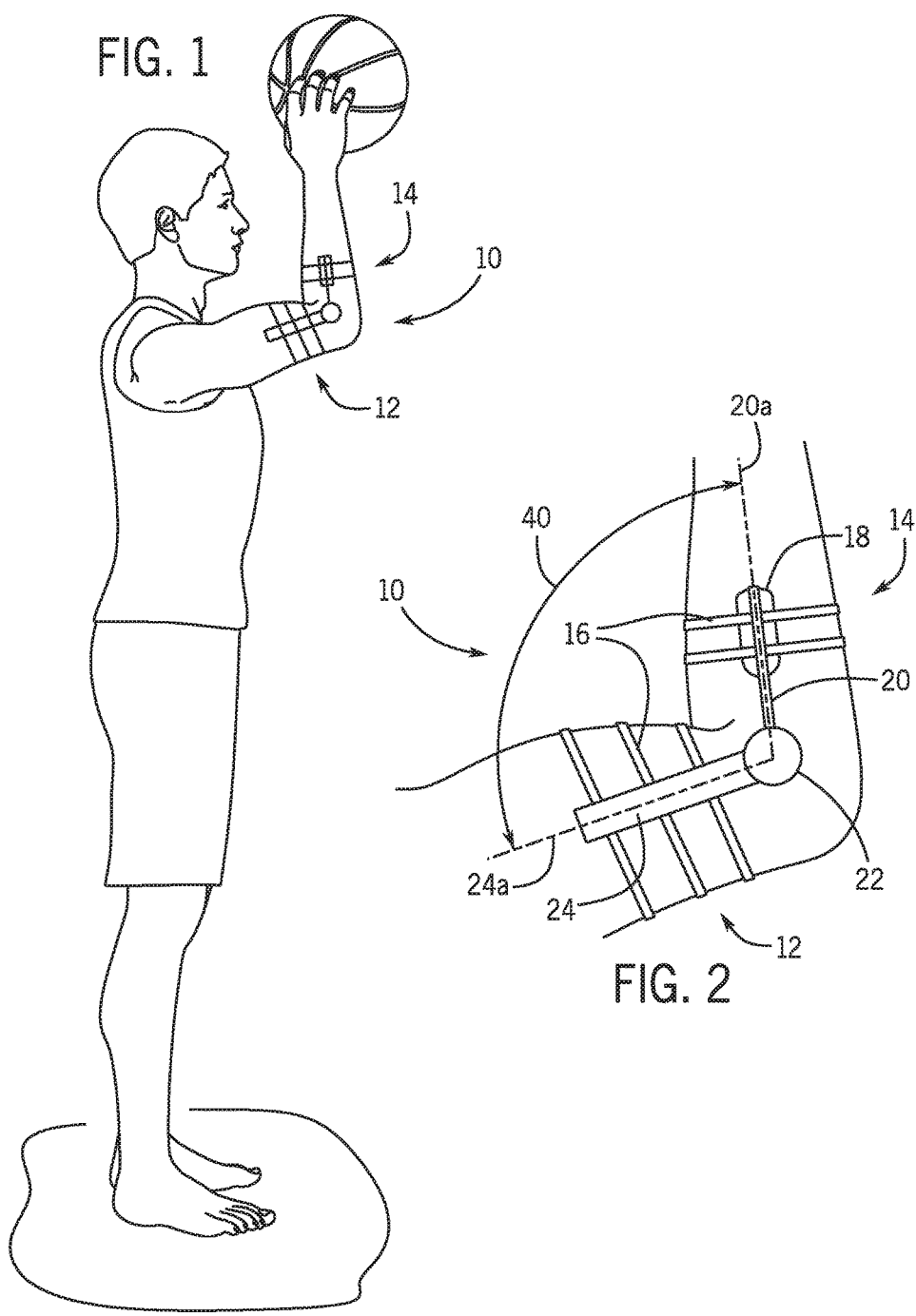

US 10,195,509 B1

BASKETBALL TRAINING APPARATUS WITH REAL-TIME USER FEEDBACK ON SHOOTING FORM

RELATED APPLICATION

The application claims priority to provisional patent application U.S. Ser. No. 62/509,554 filed on May 22, 2017, the entire contents of which is herein incorporated by reference.

BACKGROUND

The embodiments herein relate generally to basketball training aids. More specifically, embodiments of the invention are related to a basketball training apparatus that provides feedback to a user pertaining to his/her shooting form.

Basketball players continually work on improving their shooting form to improve the accuracy and consistency of shots. Proper shooting mechanics require the player to keep the shooting elbow in and maneuver the shooting arm from a 90 degree angle to a 180 degree angle during the follow through while breaking the wrist and fingertips on the finish. Players practice their shooting form on drills. Although coaches may provide feedback to a player during a practice shot, it is difficult for a coach to provide instantaneous feedback to the player during the course of a shot.

Several basketball shooting tools exist as disclosed in U.S. Patent Application Publication 2012/0190483, and U.S. Pat. Nos. 8,038,549 and 5,865,695. These devices attach to a portion of the user's arm and help the user to achieve proper shooting form through the use of mechanical resistance, visual indicia or other alerts in the form of an illuminating light or sound. However, these devices are limited because: 1) the tools lack real-time feedback throughout the entire basketball shot from the beginning to the follow-through; 2) the tools lack durability because they comprise sleeves that soak sweat and can rip easily, which is not desirable when used with certain electrical components and sensors; and/or 3) the tools do not account for the undesirable "flying elbow" when generating feedback on the user's shooting form.

As such, there is a need in the industry for a basketball training apparatus with enhanced durability that addresses the limitations of the prior art, which provides real-time feedback to the user on his/her shooting form and mechanics during the course of a shot from the beginning to the follow-through.

SUMMARY

A basketball training apparatus for use to provide a user real-time feedback on shooting form is provided. The basketball training apparatus is configured to secure to an upper arm and a forearm of the user. The basketball training apparatus comprises a strut assembly comprising an upper strut pivotably mounted to a lower strut, the upper strut configured to couple to the upper arm of the user and the lower strut configured to couple to the forearm of the user, the strut assembly comprising a pivot housing at a junction of the upper and lower struts, a Hall Effect sensor disposed within the junction of the strut assembly, a pair of magnets coupled to an interior of the pivot housing of the strut assembly, a controller disposed within the upper strut of the strut assembly and electrically coupled to the Hall Effect sensor, and an alert mechanism disposed within the upper strut of the strut assembly and electrically coupled to the controller, wherein pivotal movement of the upper strut relative to the lower strut to a first optimal angle defined by a first longitudinal axis of the upper strut and a second longitudinal axis of the lower strut positions the pair of magnets in a first operational position relative to the Hall Effect sensor to enable the alert mechanism to generate a first notification, wherein pivotal movement of the upper strut relative to the lower strut to a second optimal angle formed by the first longitudinal axis of the upper strut and the second longitudinal axis of the lower strut positions the pair of magnets in a second operational position relative to the Hall Effect sensor to enable the alert mechanism to generate a second notification.

BRIEF DESCRIPTION OF THE FIGURES

The detailed description of some embodiments of the invention will be made below with reference to the accompanying figures, wherein the figures disclose one or more embodiments of the present invention.

FIG. 1 depicts a side perspective view of certain embodiments of the basketball training apparatus shown in use;

FIG. 2 depicts a side elevation view of certain embodiments of the basketball training apparatus shown in use;

DETAILED DESCRIPTION OF CERTAIN EMBODIMENTS

Figure 3:
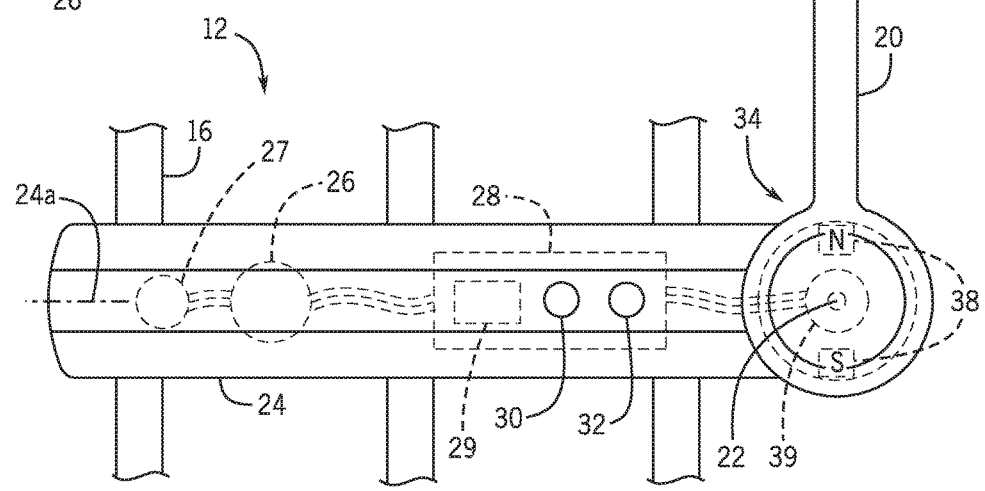
FIG. 3 depicts a side elevation view of certain embodiments of the basketball training apparatus.

As depicted in FIGS. 1-3, basketball training apparatus 10 is configured to be secured to upper arm 12 and forearm 14 of a user. During use, basketball training apparatus 10 is configured to provide real-time notifications to the user during the course of the basketball shot from the beginning to the follow-through. Basketball training apparatus 10 generally comprises a strut assembly comprising upper strut 24, lower strut 20, straps 16 and mounting pad 18.

Upper and lower struts 24, 20 are pivotably mounted together at pivot 22 and are preferably made from plastic, rubber or other material known in the field. Upper strut 24 is configured to pivotably adjust relative to lower strut 20, which adjusts angle 40. Angle 40 is formed by first longitudinal axis 24a of upper strut 24 and second longitudinal axis 20a of lower strut 20.

In one embodiment, mounting pad 18 is coupled to lower strut 20 and is configured to contact forearm 14 of the user. Mounting pad 18 may be made from any type of resilient and deformable material such as foam, rubber, or other material in the field. In one embodiment, lower strut 20 comprises a pair of telescoping struts that can slidably adjust relative to each other to one of a plurality of locking positions. This permits lower strut 20 to extend or retract to a desired length as needed to accommodate forearm 14, regardless of the user's size and age. In one embodiment, the telescoping struts of lower strut 20 are locked in the desired position using a pin-type member that engages with one of a plurality of openings disposed throughout a strut in the pair of telescoping struts.

A first set of straps 16 is coupled to upper strut 24 and is configured to be disposed around upper arm 12 of the user. Similarly, a second set of straps 16 is coupled to lower strut 20 and is configured to be disposed around forearm 14 of the user. It shall be appreciated that the first and second set of straps 16 may comprise any number of straps coupled to the strut assembly.

In one embodiment, each strap 16 is a rubberized band that can be wrapped around upper arm 12 or forearm 14, and secured to itself in one of a plurality of locking positions. This allows each strap 16 to conform to the respective arm portion of the user. In one embodiment, each strap 16 is secured in place to the desired locking position by a pin that engages with one of a plurality of openings disposed throughout the strap. It shall be appreciated that straps 16 may comprise alternative fastening mechanisms in alternative embodiments. In one embodiment, alternative fasteners such as hook and loop fasteners, snap components, and the like, may be used to secure straps 16 in place around upper arm 12 or forearm 14.

Figure 4:
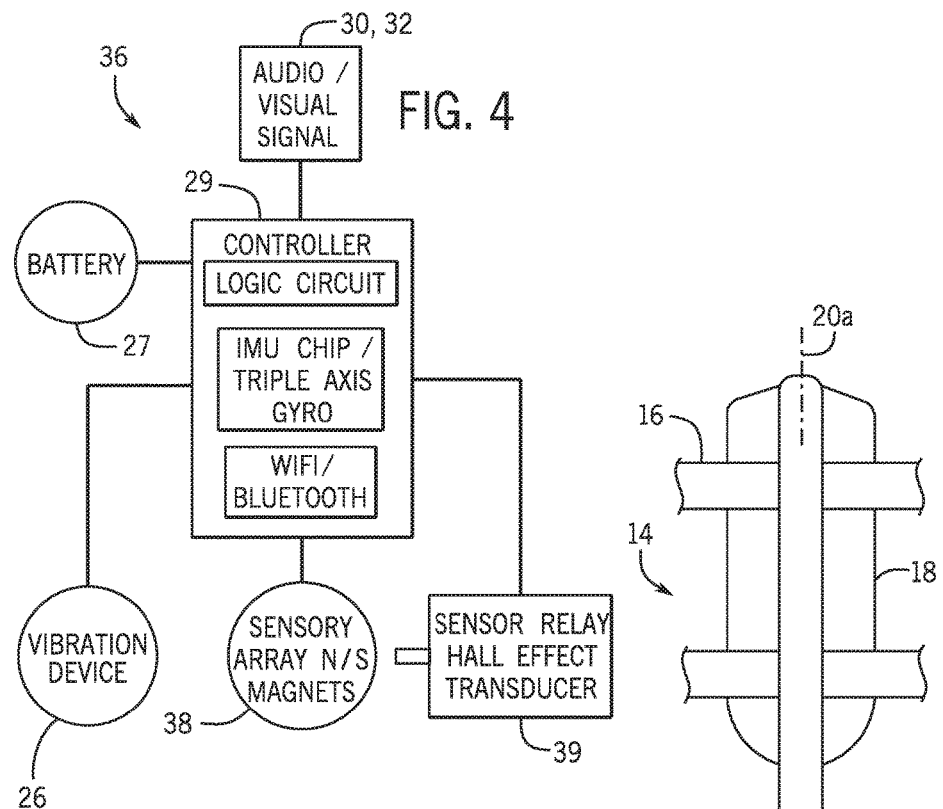
FIG. 4 depicts a schematic view of certain embodiments of the basketball training apparatus.

As depicted in FIGS. 3-4, basketball training apparatus 10 comprises controller 29, which comprises a programmable logic circuit, and Inertial Measurement Unit ("IMU") chip/triple axis gyroscope operably connected together. In one embodiment, controller 29 comprises a communication unit such as a Wi-Fi or Bluetooth device configured to transmit data generated by controller 29 to a remote device such as a smartphone, tablet or other computing device.

In certain embodiments, controller 29 is electrically coupled to vibration device 26, audio indicator 30, light indicator 32 and Hall Effect transducer 39. Controller 29 is operably connected to sensory array magnets 38, which are disposed within pivot housing 34 of pivot 22. Battery 27 is electrically coupled to controller 29 to provide power to controller 29 and any other components electrically coupled thereto. It shall be appreciated that battery 27 may be of any type including, but not limited to, an alkaline battery, rechargeable battery, or other type battery.

FIG. 4 depicts block diagram 36 illustrating the interaction of certain components of basketball training apparatus 10. In a preferred embodiment, circuit board 28, controller 29, vibration device 26 and battery 27 are disposed within upper strut 24 and electrically coupled together via wires as depicted in FIG. 3. In one embodiment, audio indicator 30 and light indicator 32 are coupled to the exterior of upper strut 24 and electrically coupled to controller 29. Vibration device 26, audio indicator 30 and light indicator 32 are configured to generate corresponding motion, audio and visual notifications to the user. It shall be appreciated that the location of these components within the strut assembly may vary in certain embodiments.

Pivot housing 34 at the junction of upper and lower struts 24, 20 comprises interior slots configured to receive a pair of sensory array magnets 38. Sensory array magnets 38 comprise a North Pole magnet and a South Pole magnet. Hall Effect transducer 39 is coupled to the central interior portion of pivot housing 34 at pivot 22 and is electrically coupled to controller 29. Pivotal movement of upper strut 24 relative to lower strut 20 permits the pair of sensory array magnets 38 to rotate around Hall Effect transducer 39.

In operation, basketball training apparatus 10 is secured to upper arm 12 and forearm 14 of the user as depicted in FIGS. 1-2. Controller 29 is enabled via a switch to activate basketball training apparatus 10 to an operational mode. Basketball training apparatus 10 provides real-time feedback to the user during the course of the basketball shot from the beginning to the follow-through.

The proper shooting form requires the user to place the upper arm and forearm at approximately 90 degrees relative to each other at the beginning of the shot. In this position, upper arm 12 extends generally parallel to the ground and forearm 14 extends upward with the elbow directed towards the ground. Upper arm 12 and forearm 14 extend upright until they are positioned generally 180 degrees relative to each other on the follow-through, at which point the wrist snaps to allow the user to release the ball to conclude the shot. As shall be apparent, ensuring the user's extension of the upper arm and forearm from 90 degrees to 180 degrees during the basketball shot is important to enhance shooting accuracy and consistency.

Basketball training apparatus 10 is configured to provide real-time notifications to the user when upper arm 12 and forearm 14 are positioned at approximately 90 degrees and 180 degrees relative to each other. In the secured position, upper strut 24 is aligned with upper arm 12 and lower strut 20 is aligned with forearm 14. As such, angle 40 formed by first longitudinal axis 24a of upper strut 24 and second longitudinal axis 20a of lower strut 20 is generally equal to the angle formed by upper arm 12 and forearm 14 of the user.

Figure 5A:
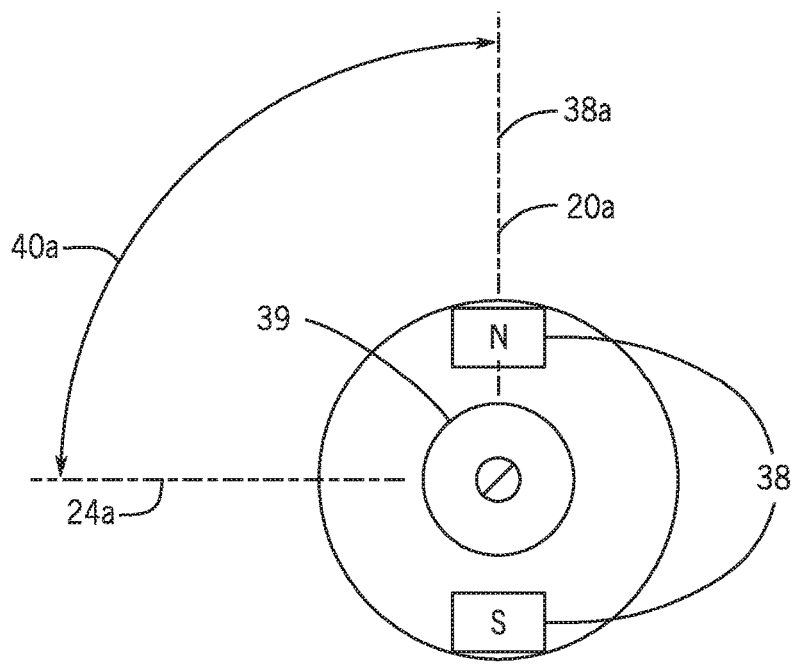
FIG. 5A depicts a schematic view of certain embodiments of the basketball training apparatus with the user's arm in a first optimal angle.

Pivotal movement of upper strut 24 relative to lower strut 20 permits the pair of sensory array magnets 38 to rotate around Hall Effect transducer 39. FIG. 5A depicts the proper shooting form at the beginning of the shot with upper and lower struts 24, 20 positioned in first operational arm position 38a. In this position, sensory array magnets 38 rotate to a first position relative to Hall Effect transducer 39 to orient first longitudinal axis 24a of upper strut 24 and second longitudinal axis 20a of lower strut 20 at first optimal angle 40a, wherein first optimal angle 40a is equal to approximately 90 degrees.

At this time, Hall Effect transducer 39 recognizes first optimal angle 40a is equal to approximately 90 degrees based on the position of sensory array magnets 38 and sends a signal to controller 29. The Inertial Measurement Unit of controller 29 then confirms basketball training apparatus 10 is in the proper orientation with upper arm 12 extending generally parallel to the ground and forearm 14 extending upward against gravity with the elbow directed towards the ground. If confirmed, controller 29 sends a signal to vibration device 26, audio indicator 30 and/or light indicator 32 to generate an alert to the user that upper arm 12 and forearm 14 are in the proper position for the beginning of the shot.

Figure 5B:
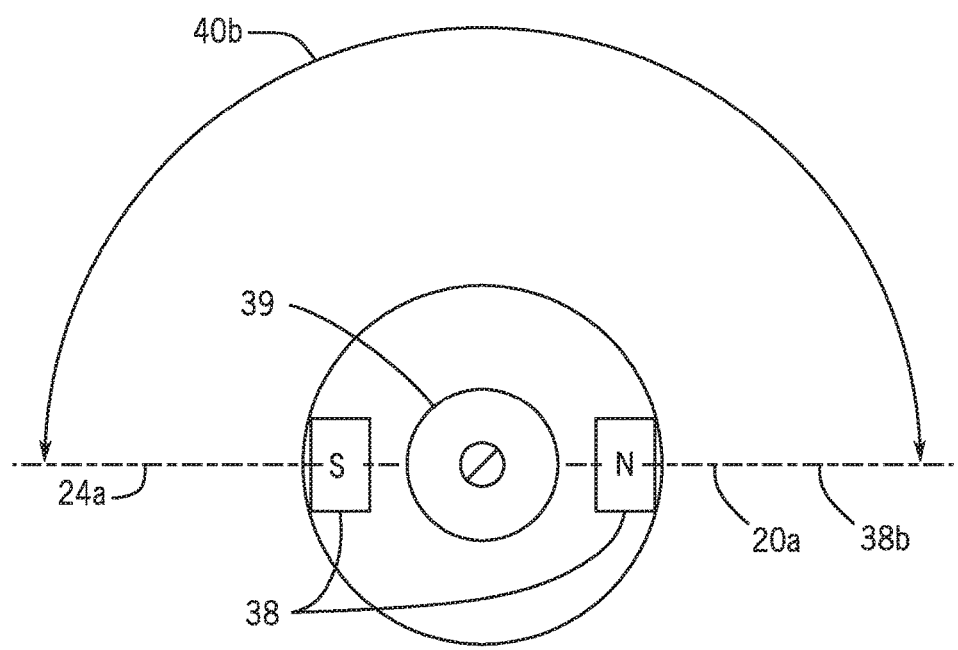
FIG. 5B depicts a schematic view of certain embodiments of the basketball training apparatus with the user's arm in a second optimal angle.

FIG. 5B depicts the proper shooting form at the follow-through of the shot with upper and lower struts 24, 20 positioned in second operational arm position 38b. In this position, sensory array magnets 38 rotate to a second position relative to Hall Effect transducer 39 to orient first longitudinal axis 24a of upper strut 24 and second longitudinal axis 20a of lower strut 20 at second optimal angle 40b, wherein second optimal angle 40b is equal to approximately 180 degrees.

At this time, Hall Effect transducer 39 recognizes second optimal angle 40b is equal to approximately 180 degrees based on the position of sensory array magnets 38 and sends a signal to controller 29. The Inertial Measurement Unit of controller 29 then confirms basketball training apparatus 10 is in the proper orientation with upper arm 12 and forearm 14 extending upward against gravity. If confirmed, controller 29 sends a signal to vibration device 26, audio indicator 30 and/or light indicator 32 to generate an alert to the user that upper arm 12 and forearm 14 are in the proper position at the follow-through of the basketball shot.

It shall be appreciated that the Inertial Measurement Unit of controller 29 is advantageous because it prevents basketball training apparatus 10 from generating an alert when upper arm 12 and forearm 14 of the user are not oriented in the proper upright shooting position, even though the strut assembly is in the first or second optimal angle 40a, 40b. As such, the Inertial Measurement Unit establishes the user's shooting elbow and arm are in the correct starting position as a prerequisite to generating notifications when arm 12 and forearm 14 are oriented at 90 degrees and 180 degrees relative to each other.

It shall be appreciated that the components of basketball training apparatus 10 described in several embodiments herein may comprise any alternative known materials in the field and be of any color, size and/or dimensions. It shall be appreciated that the components of basketball training apparatus 10 described herein may be manufactured and assembled using any known techniques in the field.

Persons of ordinary skill in the art may appreciate that numerous design configurations may be possible to enjoy the functional benefits of the inventive systems. Thus, given the wide variety of configurations and arrangements of embodiments of the present invention, the scope of the invention is reflected by the breadth of the claims below rather than narrowed by the embodiments described above.

What is claimed is:

1. A basketball training apparatus for use to provide a user real-time feedback on shooting form, the basketball training apparatus configured to secure to an upper arm and a forearm of the user, the basketball training apparatus comprising:
    a strut assembly comprising an upper strut pivotably mounted to a lower strut, the upper strut configured to couple to the upper arm of the user and the lower strut configured to couple to the forearm of the user, the strut assembly comprising a pivot housing at a junction of the upper and lower struts;
    a Hall Effect sensor disposed within the junction of the strut assembly;
    a pair of magnets coupled to an interior of the pivot housing of the strut assembly;
    a controller disposed within the upper strut of the strut assembly and electrically coupled to the Hall Effect sensor; and
    an alert mechanism disposed within the upper strut of the strut assembly and electrically coupled to the controller;
    wherein pivotal movement of the upper strut relative to the lower strut to a first optimal angle defined by a first longitudinal axis of the upper strut and a second longitudinal axis of the lower strut positions the pair of magnets in a first operational position relative to the Hall Effect sensor to enable the alert mechanism to generate a first notification, wherein pivotal movement of the upper strut relative to the lower strut to a second optimal angle formed by the first longitudinal axis of the upper strut and the second longitudinal axis of the lower strut positions the pair of magnets in a second operational position relative to the Hall Effect sensor to enable the alert mechanism to generate a second notification.

2. The basketball training apparatus of claim 1, wherein the controller comprises an Inertial Measurement Unit electrically coupled to the Hall Effect sensor, the alert mechanism configured to generate the first notification upon a determination by the Inertial Measurement Unit that the upper strut extends to the lower strut in a generally upright position against gravity, the alert mechanism configured to generate the second notification upon a determination by the Inertial Measurement Unit that the upper strut extends to the lower strut in a generally upright position against gravity.

3. The basketball training apparatus of claim 2, wherein the first optimal angle is equal to approximately 90 degrees and the second optimal angle is equal to approximately 180 degrees.

4. The basketball training apparatus of claim 3, wherein the controller comprises a communication unit configured to transmit data generated by the controller to a remote device.

5. The basketball training apparatus of claim 4, wherein the communication unit comprises a Wi-Fi or Bluetooth device.

6. The basketball training apparatus of claim 4, further comprising a first set of straps coupled to the upper strut and configured to conform around the upper arm of the user and a second set of straps coupled to the lower strut and configured to conform around the forearm of the user.

7. The basketball training apparatus of claim 6, further comprising a mounting pad coupled to the lower strut and configured to contact the forearm of the user.

8. The basketball training apparatus of claim 7, wherein the alert mechanism comprises a vibration generating device, wherein the first and second notifications comprise motion notifications.

9. The basketball training apparatus of claim 7, wherein the alert mechanism comprises an audio generating device, wherein the first and second notifications comprise audible notifications.

10. The basketball training apparatus of claim 7, wherein the alert mechanism comprises a light generating device, wherein the first and second notifications comprise visual notifications.

* * * * *